(12) United States Patent
Shibata et al.

(10) Patent No.: US 8,088,632 B2
(45) Date of Patent: Jan. 3, 2012

(54) ELEMENTAL ANALYSIS METHOD AND SEMICONDUCTOR DEVICE MANUFACTURING METHOD

(75) Inventors: Satoshi Shibata, Toyama (JP); Hisako Kamiyanagi, Toyama (JP); Fumitoshi Kawase, Toyama (JP); Tetsuyuki Okano, Toyama (JP)

(73) Assignee: Panasonic Corporation, Osaka (JP)

( * ) Notice: Subject to any disclaimer, the term of this patent is extended or adjusted under 35 U.S.C. 154(b) by 276 days.

(21) Appl. No.: 12/494,977

(22) Filed: Jun. 30, 2009

(65) Prior Publication Data

US 2010/0003770 A1    Jan. 7, 2010

(30) Foreign Application Priority Data

Jul. 1, 2008    (JP) .................................. 2008-172379

(51) Int. Cl.
*H01L 21/00*    (2006.01)
(52) U.S. Cl. ..................... 438/5; 438/7; 438/14; 438/16
(58) Field of Classification Search .................. 438/5–9, 438/12, 14, 16, 17

See application file for complete search history.

(56) References Cited

U.S. PATENT DOCUMENTS

| | | | |
|---|---|---|---|
| 5,521,377 A | 5/1996 | Kataoka et al. | |
| 5,656,812 A | 8/1997 | Takahashi | |
| 5,732,120 A * | 3/1998 | Shoji et al. ...................... | 378/45 |
| 6,255,127 B1 * | 7/2001 | Fujino et al. ..................... | 438/16 |
| 6,476,389 B1 | 11/2002 | Konakawa et al. | |
| 6,855,928 B2 * | 2/2005 | Marsh .............................. | 850/43 |
| 7,653,236 B2 * | 1/2010 | Takahashi ...................... | 382/145 |
| 2007/0274455 A1 * | 11/2007 | Tarawneh et al. ............. | 378/177 |

FOREIGN PATENT DOCUMENTS

JP    2001-235436    8/2001

* cited by examiner

*Primary Examiner* — Kevin M Picardat
(74) *Attorney, Agent, or Firm* — McDermott Will & Emery LLP

(57) ABSTRACT

Protons are entered into a substrate to be analyzed at a proton incident angle larger than 0° and smaller 90°. Excited by the entered protons and emitted from the substrate to be analyzed, the characteristic X-ray is measured by an energy dispersive X-ray detector and the like. Impurity elements present in the substrate to be analyzed are identified based on the measured characteristic X-ray. The in-plane distribution in the substrate can be obtained by scanning the proton beam. The in-depth distribution can be obtained by entering protons at different proton incident angles. The elemental analysis method can be applied to semiconductor device manufacturing processes to analyze metal contamination or quantify a conductivity determining impurity element on an inline basis and with a high degree of accuracy.

24 Claims, 7 Drawing Sheets

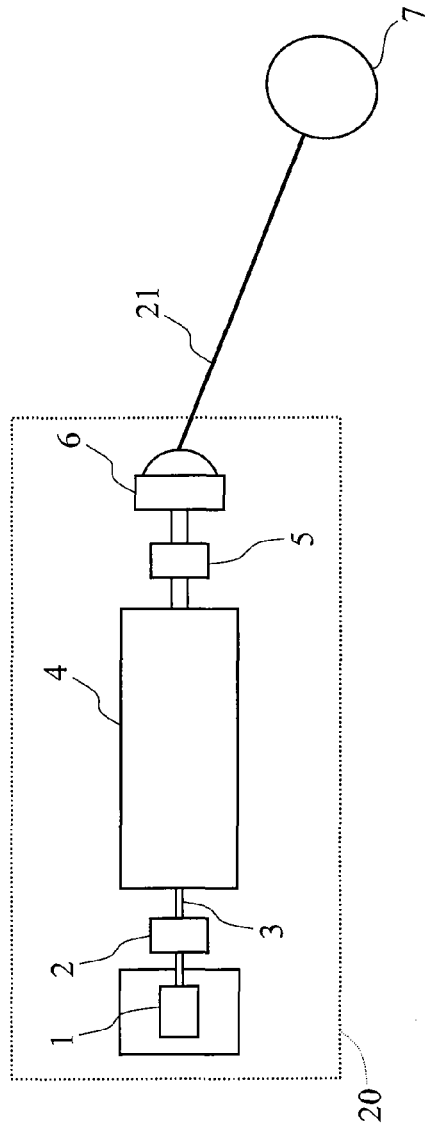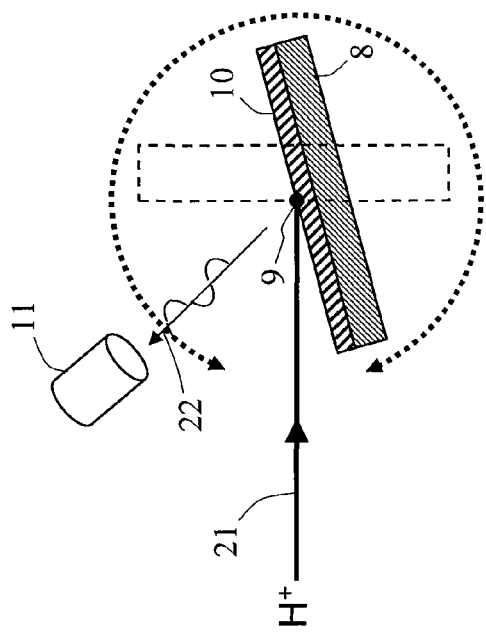

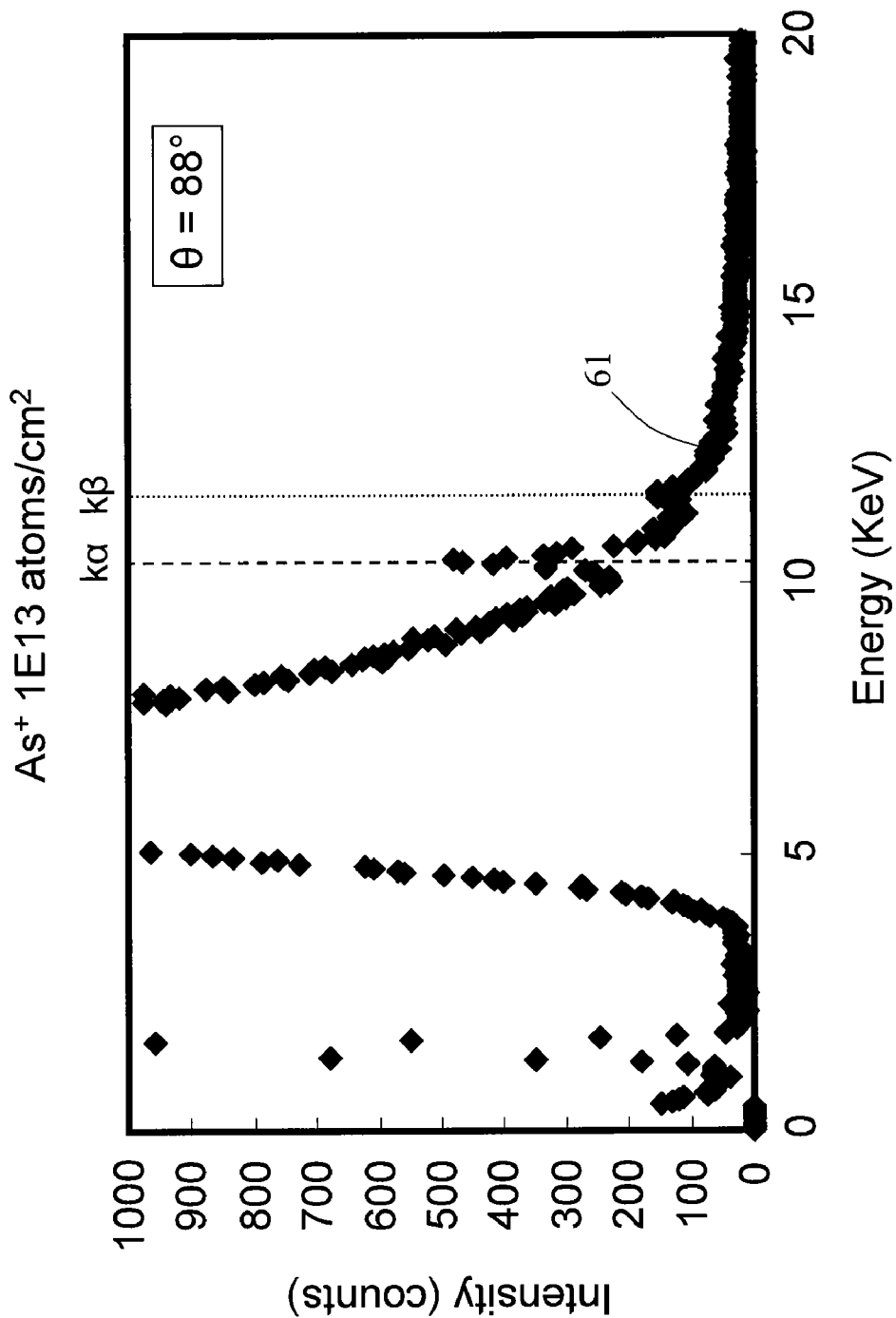

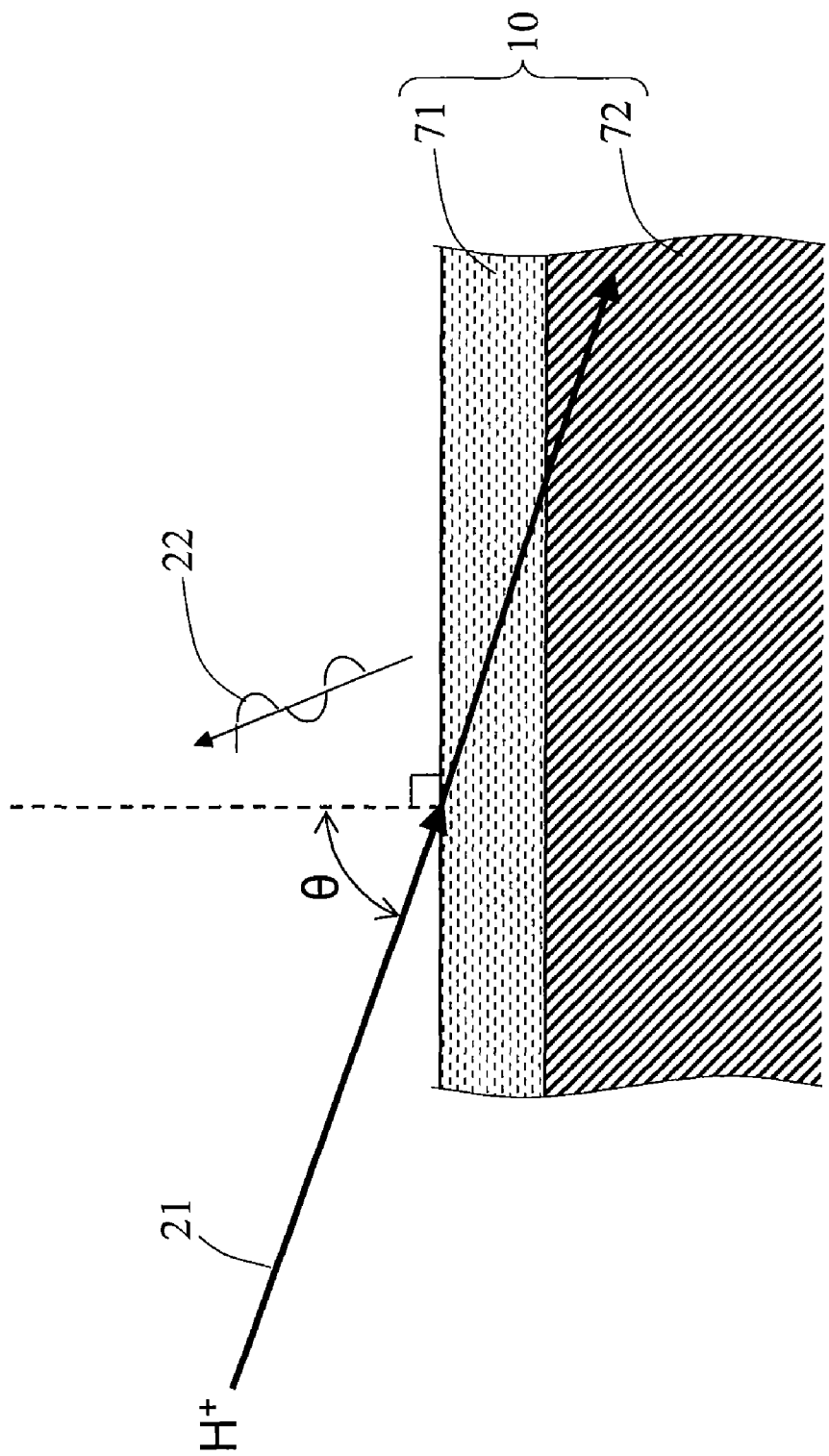

ELEMENTAL ANALYSIS METHOD AND SEMICONDUCTOR DEVICE MANUFACTURING METHOD

CROSS-REFERENCE TO RELATED APPLICATION

The disclosure of Japanese Patent Application No. 2008-172379 filed Jul. 1, 2008 including specification, drawings and claims is incorporated herein by reference in its entirety.

BACKGROUND OF THE INVENTION

1. Field of the Invention

The present invention relates to an elemental analysis method and semiconductor device manufacturing method, and especially relates to a novel elemental analysis method for measuring and analyzing tiny amounts of heavy metal impurities mixed deep into a semiconductor substrate or a conductivity determining impurity dose introduced in a semiconductor substrate in a semiconductor integrated circuit device manufacturing process, etc. and a semiconductor device manufacturing method using the elemental analysis method.

2. Description of the Related Art

Heavy metal contamination, which likely causes defective characteristics in semiconductor integrated circuit devices, should be prevented in a semiconductor integrated circuit device manufacturing process. Particularly, in a manufacturing process of CCD (charge coupled device) type or MOS (metal oxide semiconductor) type solid-state image pick-up devices, heavy metal impurities, such as iron (Fe), nickel (Ni), copper (Cu), and chromium (Cr), mixed into a silicon substrate during the process cause defective characteristics called white defects on a display screen and directly and adversely affect manufacturing yield of the devices. Therefore, strict contamination control should be performed on manufacturing apparatuses in each manufacturing step of solid-state image pick-up devices.

Particularly, a silicon substrate surface is highly possibly subject to direct exposure to a processing atmosphere during ion implantation or plasma etching. As is well known, the ion implantation and plasma etching on a silicon substrate is preformed in a chamber. The chamber and members provided in the chamber are made of metal materials such as aluminum. The metal materials contain tiny amounts of the aforementioned heavy metal elements. The implanted ions and plasma has energy and sputters the metal materials constituting the chamber and members provided in the chamber during ion implantation or plasma etching. Some of the sputtered metal materials reach the surface of the silicon substrate. The heavy metal particles generated in the chamber as a result of such sputtering also have a certain level of energy. Therefore, there is always a risk of heavy metals entering the silicon substrate during ion implantation or plasma etching.

For the purpose of controlling the heavy metal contamination or comprehending the state of heavy metal contamination on the silicon substrate in the manufacturing process as described above, various elemental analysis methods are used in the semiconductor device manufacturing process. Among such elemental analysis methods, atomic absorption spectrometry (AAS), inductively coupled plasma mass spectrometry (ICP-MS), total reflection X-ray fluorescence analysis (TXRF), and secondary ion mass spectrometry (SIMS) are well known.

In atomic absorption spectrometry (hereafter referred to as the AAS method), a sample is irradiated with light having a wavelength in accordance with an element to be analyzed (target element) (for example approximately 200 to 850 nm) to quantify the target element contained in the sample. More specifically, a sample is heated and atomized, and then irradiated with light so that the atoms of the target element make the transition from the initial low energy level (ground level) to another excited level (excited state) by the irradiation light. The amount of the absorbed light having a characteristic wavelength corresponding to a difference in energy between these levels is measured to quantify the target element in the sample. The sample introduced in the analysis apparatus is in a liquid form (sample solution). When an object to be analyzed is in a solid form, the object is dissolved in a solvent to prepare a sample solution for use. Therefore, even a small amount of sample can be measured.

In inductively coupled plasma mass spectrometry (hereafter referred to as the ICP-MS method), a sample is ionized by inductively coupled plasma under an atmospheric pressure and generated ions are separated in accordance with a mass-charge ratio (mass/charge number) in a mass separation unit. Then, the number of ions that have entered a detector is measured as electric signals to qualitatively and quantitatively analyze the elements contained in the sample. The sample introduced in the analysis apparatus is in a liquid form (sample solution) and, for example, HCl, HF, $HNO_3$, $NH_4OH$, or $H_2O_2$ can be used as solvent. This method characteristically allows for quick multi-elemental analysis; many elements can be quantified at a level of ng/L (ppt: parts per trillion), which is lower than a detection lower limit of other elemental analysis method. Isotope ratio measurement is also available.

In total reflection X-ray fluorescence analysis (hereafter referred to as the TXRF method), a fluorescent X-ray is entered into a sample at an angle at which the fluorescent X-ray totally reflects at the surface of the sample so as to qualitatively/quantitatively analyze the elements contained in the sample. Inner orbital electrons of the atoms contained in the sample are excited by the entered fluorescent X-ray and make the transition to outer orbits, whereby the outer orbital electrons make the transition to the inner orbits where the excited electrons are present. The X-ray emitted then has energy equal to a difference in energy between the outer and inner orbit energy levels. The difference in energy is specific to the element. Therefore, the element species is identified by analyzing the energy of the X-ray emitted from the sample using an energy dispersive X-ray detector and the element is quantified based on the signal intensity. In this analysis method, the fluorescent X-ray entering the sample is totally reflected at the surface of the sample, significantly reducing a background scattered X-ray emitted from the sample along with the element-specific X-ray. Consequently, the signal intensity-to-background X-ray intensity ratio (S/N ratio) is improved and the characteristic X-ray spectrum of tiny amounts of substance elements can be observed with accuracy. However, in this analysis method, the fluorescent X-ray enters the sample surface at a total reflection angle of approximately 0.5 degree or smaller; therefore, the X-ray does not penetrate deep into the sample. Consequently, this method is suitable for obtaining the element information at a depth of approximately 1 to 100 nm from the sample surface.

Currently, the sample is pretreated by a vapor phase decomposition (VPD) technique to concentrate existing heavy metals for improved analysis sensitivity in the AAS, ICP-MS, and TXRF methods. Here, the VPD technique will be explained. For example, when a sample is a wafer having a silicon oxide film, first, only the oxide film on the wafer is decomposed with HF (hydrofluoric acid) vapor so that the wafer surface becomes hydrophobic. Then, the wafer surface is scanned with a liquid droplet so that the droplet absorbs the substances to be analyzed, such as heavy metals, remaining on the wafer surface and the droplet is collected. The collected droplet is dropped on a wafer and dried under reduced pressure to form a dried taint in which the substances to be analyzed are concentrated. The dried taint is measured for example by the total reflection fluorescent X-ray analysis. The VPD technique concentrates the elements to be analyzed and therefore particularly useful for detecting heavy metal and other elements that are extensively distributed on the wafer in a shallow, two-dimensional manner. Conversely, when heavy metal and other elements are present deep within the wafer (several tens μm), the VPD technique cannot be used to concentrate them. When heavy metal and other elements are scattered about the wafer surface, the dried taint of the droplet containing the elements to be analyzed may be scattered about more extensively than their original positions. In such a case, the concentration of element per unit area may be decreased and the sensitivity may accordingly be reduced. In addition, the sample is destroyed when the wafer surface is made hydrophobic.

On the other hand, in the semiconductor technical field, heavy metal elements can qualitatively and quantitatively be analyzed also by the secondary ion mass spectrometry (SIMS) analysis that is used for measuring an injection amount of ion-implanted conductivity determining impurities or by the time of flight SIMS (TOF-SIMS) analysis used for observing an uppermost surface. In SIMS analysis, the sample surface is irradiated with an ion beam such as $O_2^+$ and $Cs^+$ having energy of several KeV to sputter the sample surface part and release the atoms and secondary ions at the sample surface in a vacuum. The released secondary ions are drawn by an electric field and subject to mass analysis using a magnetic field or high frequency electric field. Therefore, the in-depth distribution of the impurity element concentration can be known with accuracy. In this analysis method, a diameter of the ion beam entered into the sample surface or the analysis area resolution is as small as several tens nm to 10 μm. Therefore, it is a particularly useful analysis technique where the positions of heavy metals are known or where the heavy metals are distributed on the sample surface two-dimensionally in a sheet-like form.

Recently in the semiconductor technical field, it has been required to measure and control an actual injection amount of conductivity determining impurities ion-implanted in a semiconductor substrate with the measurement uncertainty of within several % as the semiconductor integrated circuit patterns become finer and the elements have a higher density. Known means for measuring the actual injection amount of conductivity determining impurities include a sheet resistance measurement, thermal wave method, SIMS analysis method, etc.

As is well known, the sheet resistance measurement is used to measure the resistance of a thin layer having a uniform thickness. A bulk resistance is expressed by resistivity× sample length/sample cross-sectional area while a sheet resistance is expressed by resistivity/sample thickness (unit: $\Omega/\square$). Therefore, the sheet resistance is not a simple indicator of the concentration of conductivity determining impurities contained in the layer but an indicator of the concentration of conductivity determining impurities electrically activated in the layer provided that the thickness of the layer is known.

On the other hand, the thermal wave method is used to estimate the injection amount using a property in which a magnitude of damage (lattice defect) introduced in a silicon substrate by ion implantation is proportional to the injection amount. When a silicon substrate receives a thermal shock by a laser beam, a degree of displacement (deformation) of the substrate surface varies depending on the presence/absence of damage. In this technique, the magnitude of damage introduced in the silicon substrate by ion implantation is estimated based on the change in the degree of displacement and the ion injection amount is estimated. However, the degree of displacement of the substrate surface is also affected by surface roughness that is increased by oxygen plasma ashing of a resist film or cleaning in the semiconductor device manufacturing process. Therefore, for estimating the injection amount in the substrate in a process that is subject to some substrate treatment other than ion implantation, such as plasma ashing and cleaning, in general, a reference substrate that is not subject to any treatment but ion implantation as described above is separately prepared and the magnitude of damage is estimated in relative comparison with the reference substrate. SIMS analysis is as described above. Japanese Laid-Open Patent Application Publication No. 2001-235436 discloses a conventional elemental analysis technique relating to the present application.

SUMMARY OF THE INVENTION

A semiconductor substrate can be contaminated with heavy metals and the like in various ways. For example, small amounts of heavy metals such as Fe, Ni, Cu, and Cr may be introduced and distributed locally and several μm to several tens μm deep within a substrate. Even such distribution has a significant adverse effect on electric properties of some semiconductor devices (for example solid-state image pick-up devices). Therefore, it is important to detect such metal contamination so as to control the manufacturing process. The inventors of this application reviewed the heavy metal contamination and found the following possible events in practice.

More specifically, in the actual semiconductor device manufacturing process, the substrate is repeatedly treated in a chamber in multiple steps such as ion implantation, plasma etching and oxygen plasma ashing. As described above, metal elements contained in the metallic materials constituting the chamber may be introduced in the substrate while the substrate is treated in each step of treating the substrate in a chamber. In the case of multiple such steps, once heavy metal impurities adhere to the substrate surface in one of such steps, the heavy metal impurities adhering to the substrate may gradually be pushed deep within the substrate in subsequent steps. For example, colliding with implanted ions, heavy metal impurities are pushed inside the substrate during ion implantation. Colliding with ions splashed from the plasma to the substrate, heavy metal impurities are pushed inside the substrate during plasma etching or plasma ashing. After such a step is repeatedly performed, heavy metal impurities are continuously pushed inside the substrate and reach deep within the substrate. In other words, heavy metal impurities are not only introduced in the uppermost surface of the substrate in a single step but also possibly introduced deep within the substrate as a result of mutual influence of multiple steps using energetic particles. Furthermore, heavy metal impurities are diffused in the substrate also in the depth direction thereof because of applied heat in heat treatment steps such as film formation steps.

Therefore, heavy metal elements that have entered deep within the substrate should be detected in the semiconductor device manufacturing process.

Conversely, the elements to be analyzed are dissolved in a solution and concentrated in the above described AAS and ICP-MS methods. Then, heavy meal impurities contained deep within the substrate can be analyzed by dissolving the substrate to that depth and preparing a sample solution. However, such a method does not reveal the distribution, namely whether the heavy metal impurities are localized. On the other hand, the SIMS or TOF-SIMS analysis can identify the positions and concentrations of heavy metal impurities. However, only a small area can be analyzed (measured) at a time. Therefore, the regions in the semiconductor substrate where heavy metal impurities are present have to be presumed in advance with accuracy. When such regions are unknown, it is difficult to identify the positions where heavy metal impurities are present within a practical period of time. Furthermore, the TXRF method only allows for analysis of the uppermost surface of a sample in principle. Therefore, heavy metal impurities distributed deep within a semiconductor substrate cannot be detected. As described above, the above described analysis methods all have difficulty in detecting the positions and concentrations of impurities such as heavy metals concurrently when they are distributed relatively locally and deep within a semiconductor substrate.

It is desirable in the metal contamination control of a manufacturing process to analyze a product in process as it is and to obtain metal contamination information on the product in process. However, in practice, for example, the AAS method prepares an analytical substrate on the surface of which a silicon oxide film that is easy to contain heavy metal impurities and to remove selectively for the substrate is pre-deposited. More specifically, the analytical substrate is treated along with product substrates and the silicon oxide film of the analytical substrate is removed for analysis. In such a case, if, for example, a resist film is formed on the analytical substrate to give it a closer form to the product in process, a chemical concurrently dissolving the resist film and silicon oxide film should properly be selected to obtain a sample solution. Furthermore, it is difficult to dissolve the resist film when it is hardened by ion implantation or plasma treatment. Therefore, the structure of an analytical substrate is inevitably restricted and it is difficult to analyze the product in process as it is. The inductively coupled plasma method using a sample solution for analysis also has the same problem.

On the other hand, there is the following problem with measuring the injection amount of conductivity determining impurities. The junction depth due to ion implantation energy should be taken into account in the sheet resistance measurement. If the junction depth is not accurate, an accurate measurement of the injection amount of conductivity determining impurities cannot be obtained. Similarly, in the thermal wave method, the injection amount is relatively estimated from the magnitude of damage formed in the semiconductor substrate by ion implantation and it is difficult to evaluate by the absolute value. SIMS analysis allows for direct measurement of the absolute value of the injection amount of conductivity determining impurities. However, large fluctuation occurs in a compositional change due to sputtering of the sample surface and the measurement uncertainty is approximately 10%. For this reason, it is difficult to satisfy the accuracy of measurement required in the semiconductor device manufacturing including future micro-structuring processes of 65 nm or smaller nodes, particularly in implantation for threshold voltage control of ultrasmall system MOSLSIs (MOS large scale integrated circuits), implantation for source/drain extension regions, and implantation for photodiodes in solid-state image pick-up devices.

In view of the above circumstances, the purpose of the present invention is to provide an elemental analysis method that allows for analysis of tiny amounts of metal impurity elements present in multiple local regions of approximately several square mm on the surface of and inside a semiconductor substrate throughout the substrate surface in a practically feasible period of time, allows for analysis of metal impurity elements present several μm to several tens μm deep, and allows for analysis on a sample having a similar form to the product substrate structure in process, and a semiconductor device manufacturing method using this elemental analysis method. Another purpose of the present invention is to provide an elemental analysis method that allows for measurement of the injection amount of conductivity determining impurities to a high degree of accuracy and a semiconductor device manufacturing method using this elemental analysis method.

The present invention provides an elemental analysis method employing a particle induced X-ray emission (PIXE) technique using an ion accelerator and a semiconductor device manufacturing method using this elemental analysis method. First, the basic principle of PIXE will be described. When a solid sample is irradiated with a particle beam (a proton beam or an ion beam such as a helium ion beam) having energy of several MeV, the inner orbital electrons nearly in the ground state among the atomic electrons are excited to the higher energy orbits and the outer orbital electrodes make the transition to the inner orbits where the excited electrons were present. Meanwhile, the characteristic X-ray having the energy corresponding to the difference in energy between the energy levels of the shells is released from the sample. The wavelength of the characteristic X-ray has an element-specific value. Therefore, detection of the characteristic X-ray leads to identification of the element. For example, the characteristic X-ray released upon transition from the atomic shell L to the atomic shell K is named the kα ray and the characteristic X-ray released upon transition from the atomic shell M to the atomic shell K is named the kβ ray. For example, when the particle beam is a proton beam, it is known from experiments that the optimum incident energy value of the proton beam preferable for observation of such characteristic X-rays is 3 MeV. Currently, the PIXE is used primarily in the fields such as medical technology, biology, science of fisheries, environmental chemistry, food products, engineering/earth science, and archaeology.

The characteristic X-ray excited by an ion beam can be detected using an energy dispersive X-ray (EDX) detector with significantly low background. The spatial resolution in an analytical region varies depending on the beam diameter. The analysis can be done with a spatial resolution on the order of several mm using a conventional accelerator and particularly on the order of 1 μm using the micro-beam PIXE (micro-PIXE). When the proton beam has an incident energy of 3 MeV and the sample is a silicon monocrystal substrate, a range of protons is 92 μm. Therefore, elements present significantly deep within the substrate can characteristically be detected. In consideration of the range of protons in a silicon monocrystal substrate, elements up to approximately 40 μm deep from the surface can presumably be detected well.

However, in this elemental analysis method, a continuous spectrum from bremsstrahlung caused by interactions between the ions entered in the semiconductor substrate and the lattice crystal in the semiconductor substrate is detected. For example, when the sample is a silicon monocrystal substrate, the continuous spectrum from proton bremsstrahlung occurs continuously in an energy range from several KeV to several tens KeV. Therefore, the characteristic X-ray peaks in this energy range are buried in the continuous spectrum from bremsstrahlung. The characteristic X-rays of heavy metal impurities such as Fe, Ni, Cu, and Cr that are elements responsible for metal contamination and a conductivity determining impurity arsenic (As) fall within this energy range. Then, the PIXE does not have detection sensitivity sufficient for measurement in which these elements are targeted for detection and so far is not used for analyzing impurity elements in the semiconductor technical field. However, the inventors of the present invention have overcome this problem and achieved the invention of the present application.

In order to achieve the above purposes, the present invention adopts the following technical means. First, the present invention is supposed to be an elemental analysis method for detecting impurity elements contained in a substrate. In the elemental analysis method relating to the present invention, an ion beam is entered into a substrate to be analyzed at an ion beam incident angle larger than 0° and smaller than 90°. Then, a characteristic X-ray excited by the entered ion beam and emitted from the substrate is measured using an energy dispersive X-ray detector and the like. Impurity elements present in the substrate to be analyzed are identified based on the measured characteristic X-ray. Here, the ion beam incident angle is defined as an angle between a normal line to a surface of the substrate to be analyzed and an incident direction of the ion beam.

In this elemental analysis method, a signal-noise ratio (S/N ratio) of the characteristic X-ray peaks of impurity elements to be detected to the intensity of the continuous spectrum from bremsstrahlung of ions (for example protons) that can be background noise in a X-ray spectrum in an energy range can be improved. Consequently, the impurity elements can be detected in a highly sensitive manner. Furthermore, in this method, impurity elements present relatively deep within the substrate can be detected in a highly sensitive manner.

In this elemental analysis method, for example, the ion beam can be scanned over the substrate to be analyzed so as to enter the ion beam and measure the characteristic X-ray at multiple points on the substrate to be analyzed. In such a case, an in-plane distribution of abundance in the substrate of the impurity elements identified by the characteristic X-ray can be obtained based on intensities of the characteristic X-ray measured at the multiple points on the substrate. Furthermore, the ion beam incident angle can be changed so as to enter the ion beam at multiple ion beam incident angles. In such a case, an in-depth distribution of abundance in the substrate of the impurity elements identified by the characteristic X-ray can be obtained based on intensities of the characteristic X-ray measured with the multiple ion beam incident angles.

The substrate can be, for example, a silicon monocrystal substrate. The substrate can be a substrate having an organic resin film containing substantially no silicon element on a silicon monocrystal substrate. The organic resin film is, for example, a resist film. When such a substrate is used, typical impurity elements to be detected are an impurity element determining the conductivity in a silicon monocrystal substrate and metal elements responsible for metal contamination. When the substrate is a substrate having an organic resin film containing substantially no silicon element on a silicon monocrystal substrate, most impurity elements are contained in the organic resin film, whereby the detection sensitivity to impurity elements can significantly be improved. In the above elemental analysis method, the ion beam is preferably a proton beam.

From the viewpoint of improving the detection sensitivity to impurity elements, the substrate having an organic resin film containing substantially no silicon element on a silicon monocrystal substrate is applicable to a total reflection X-ray fluorescence analysis. More specifically, in this elemental analysis method, a fluorescent X-ray is entered into a substrate to be analyzed having an organic resin film on a silicon monocrystal substrate with an angle made with a surface of the substrate to be analyzed being not larger than 0.5°. A characteristic X-ray excited by the entered fluorescent X-ray and emitted from the substrate to be analyzed is measured using an energy dispersive X-ray detector and the like. Impurity elements present in the substrate to be analyzed are identified based on the measured characteristic X-ray. This elemental analysis method is particularly preferable when the impurity element is phosphorus or aluminum.

On the other hand, in another aspect, the present invention provides a semiconductor device manufacturing method using the above described elemental analysis method. The semiconductor device manufacturing method relating to the present invention is a semiconductor device manufacturing method having a step of ion-implanting a conductivity determining impurity element in a silicon monocrystal substrate. In this semiconductor device manufacturing method, first, a conductivity determining impurity element is introduced into a first silicon monocrystal substrate intended to form a semiconductor element in the first ion implantation step. Then, in the second ion implantation step, the conductivity determining impurity element is introduced into a second silicon monocrystal substrate under the same ion implantation conditions as in the first ion implantation step. Then, an ion beam is entered into the second silicon monocrystal substrate at an ion beam incident angle larger than 0° and smaller than 90°. A characteristic X-ray excited by the entered ion beam and emitted from the conductivity determining impurity element introduced in the second silicon monocrystal substrate is measured using an energy dispersive X-ray detector and the like. Then, an injection amount of the conductivity determining impurity element in the second ion implantation is calculated based on the measured characteristic X-ray intensity as an injection amount of the conductivity determining impurity element in the first ion implantation.

With this semiconductor device manufacturing method, the injection amount of the conductivity determining impurities introduced in the second silicon substrate can be measured with accuracy. Therefore, the injection amount of the conductivity determining impurities introduced in the first silicon monocrystal substrate intended to form the semiconductor element can be estimated with accuracy. Here, the second silicon monocrystal substrate can be a product substrate intended to form a semiconductor element or an evaluation substrate intended to measure the injection amount.

The present invention can further provide another semiconductor device manufacturing method having a step of ion-implanting a conductivity determining impurity element in a silicon monocrystal substrate. In this semiconductor device manufacturing method, first, a conductivity determining impurity element is introduced into a first substrate that is a silicon monocrystal substrate intended to form a semiconductor element in the first ion implantation step. Then, in the second ion implantation step, the conductivity determining impurity element is introduced into a second substrate having an organic resin film containing substantially no silicon element on a silicon monocrystal substrate under the same implantation conditions as in the first ion implantation. Then, an ion beam is entered into the second substrate at an ion beam incident angle larger than 0° and smaller than 90°. A characteristic X-ray excited by the entered ion beam and emitted from the conductivity determining impurity element introduced in the second substrate is measured using an energy dispersive X-ray detector and the like. Then, an injection amount of the conductivity determining impurity element in the second ion implantation is calculated based on the measured characteristic X-ray intensity as an injection amount of the conductivity determining impurity element in the first ion implantation.

With this semiconductor device manufacturing method, the injection amount of the conductivity determining impurities introduced in the second silicon monocrystal substrate can be calculated in a highly sensitive manner. Therefore, the injection amount of the conductivity determining impurities introduced in the first silicon monocrystal substrate intended to form a semiconductor element can be estimated with accuracy even if it is ion-implanted at a low dose amount. Here, the second silicon monocrystal substrate can be a product substrate intended to form the semiconductor element or an evaluation substrate intended to measure the injection amount.

The present invention can further provide a semiconductor device manufacturing method allowing for accurate comprehension of the abundance of metal elements responsible for metal contamination. In this semiconductor device manufacturing method, first, a predetermined treatment including ion implantation or plasma treatment is performed on a first substrate intended to form a semiconductor element. Then, the same treatment is performed on a second substrate under the same conditions as the predetermined treatment. Then, an ion beam is entered into the second substrate at an ion beam incident angle larger than 0° and smaller than 90°. A characteristic X-ray excited by the entered ion beam and emitted from the second substrate is measured. Then, metal elements present in the second substrate are detected based on the measured characteristic X-ray. Here, the predetermined treatment is not restricted to a single treatment, ion implantation or plasma treatment, and includes treatment in which at least one of ion implantation and plasma treatment and another treatment are continuously performed.

With this semiconductor device manufacturing method, the abundance of metal elements in the second substrate can be measured with accuracy. Therefore, the abundance of metal elements in the first substrate intended to form a semiconductor element can be estimated with accuracy. Here, the second substrate can be a product substrate intended to form the semiconductor element or an evaluation substrate intended to measure the amounts of metal elements. The second substrate can be a substrate having an organic resin film containing substantially no silicon element on a silicon monocrystal substrate. In this way, the metal elements can be detected in a more sensitive manner. Even the abundance of tiny amounts of metal elements present inside the first substrate can be estimated.

From the viewpoint of accurate comprehension of the abundance of metal elements responsible for metal contamination, the present invention can provide a further other semiconductor device manufacturing method. In this semiconductor device manufacturing method, first, a predetermined treatment including ion implantation or plasma treatment is performed on a substrate including a silicon monocrystal substrate intended to form a semiconductor element. After the predetermined treatment, various films formed on the treated silicon monocrystal substrate for constituting the semiconductor element are removed. Then, an ion beam is entered into the substrate from which the various films are removed at an ion beam incident angle larger than 0° and smaller than 90°. A characteristic X-ray excited by the entered ion beam and emitted from the substrate is measured. Then, the metal elements present in the substrate from which the various films are removed are detected based on the measured characteristic X-ray. Here, the predetermined treatment is not restricted to a single treatment, ion implantation or plasma treatment, and includes treatment in which at least one of ion implantation and plasma treatment and another treatment are continuously performed.

With this semiconductor device manufacturing method, the metal elements are measured on an actual product substrate from which various films formed on a silicon monocrystal substrate for constituting a semiconductor element are removed. Therefore, the abundance of metal elements in the product substrate can be estimated with accuracy.

The above semiconductor device manufacturing methods including detection of metal elements are particularly preferable for example when the above described semiconductor element is a solid-state image pick-up element. Furthermore, in the above semiconductor device manufacturing methods, the ion beam is preferably a proton beam.

The elemental analysis method relating to the present invention allows for qualitative and quantitative analysis of impurity elements (semiconductor determinant impurity elements or metal elements) present deep within a semiconductor substrate, particularly in a silicon monocrystal substrate, which are difficult to detect in the conventional method, in a highly sensitive manner. Furthermore, the positions of metal elements and the like localized on the surface of or inside a substrate can be identified and quantified in a practical period of time.

The semiconductor device manufacturing method relating to the present invention allows for in-line analysis of metal contamination in the manufacturing process. Furthermore, the injection amount of a conductivity determining impurity element introduced in a semiconductor substrate by ion implantation can be measured with a high degree of accuracy.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 1A and 1B are schematic illustrations showing a PIXE analysis apparatus used in an elemental analysis method relating to the present invention.

FIG. 6 is a graphical representation showing an EDX spectrum in the third embodiment relating to the present invention.

FIG. 7 is a schematic illustration showing a sample form in the third embodiment relating to the present invention.

DETAILED DESCRIPTION OF PREFERRED EMBODIMENTS

Figure 2:
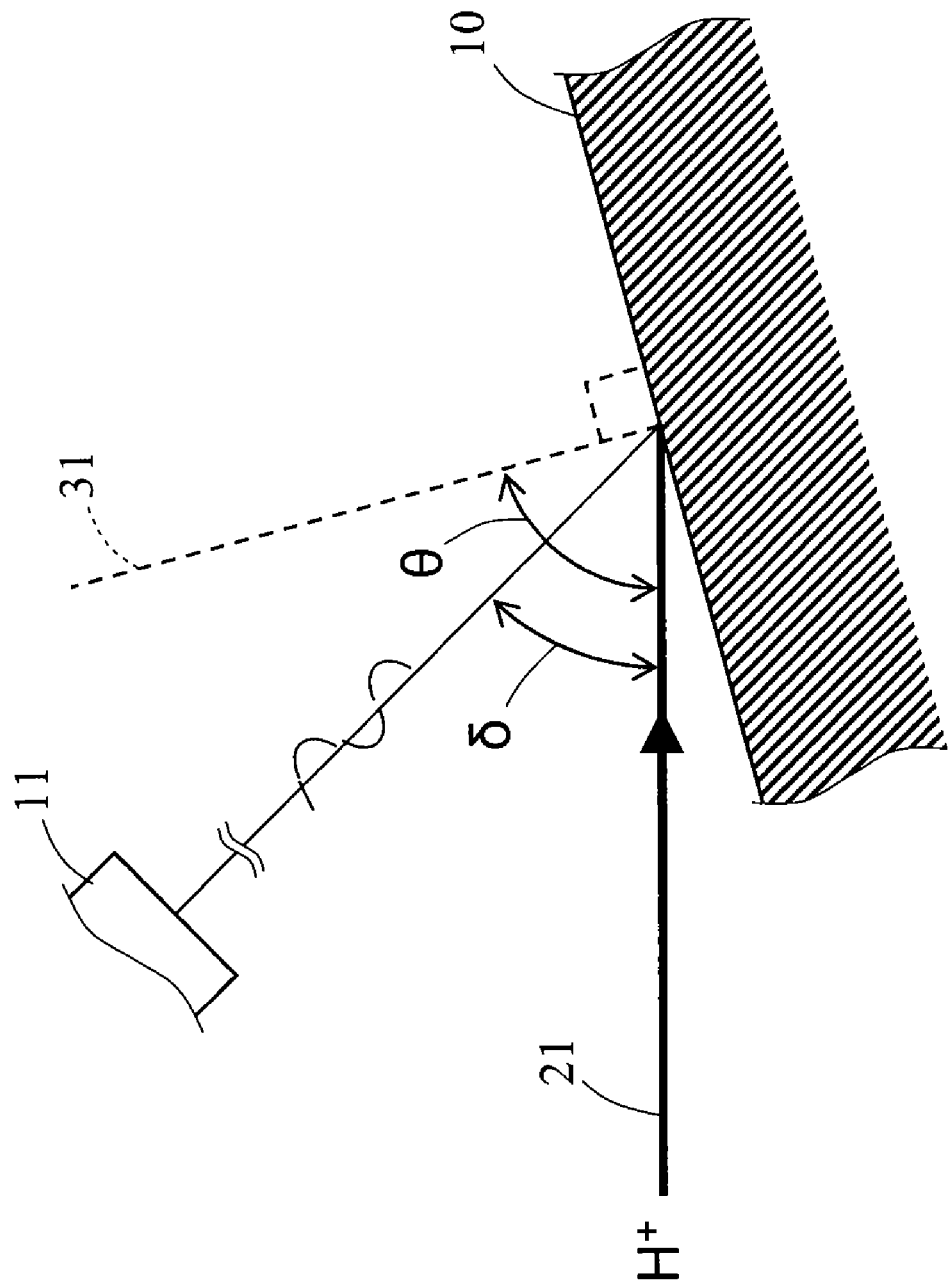
FIG. 2 is an illustration showing a proton incident angle θ.

Embodiments of the present invention will be described in detail hereafter with reference to the drawings. First, a PIXE analysis apparatus used for analyzing impurity elements (metal impurity elements and conductivity determining impurity elements) in the embodiments below will briefly be described. FIGS. 1A and 1B are schematic illustrations showing the PIXE analysis apparatus. FIG. 1A is a schematic illustration showing an entire structure of the PIXE analysis apparatus and FIG. 1B is a schematic illustration showing an analysis chamber of the PIXE analysis apparatus.

As shown in FIG. 1A, the PIXE analysis apparatus comprises a beam generation unit 20 for generating an ion beam having energy on the order of MeV and an analysis chamber 7 in which a sample to be analyzed is introduced. Ions to form an ion beam are generated in a negative ion source 1. The negative ion source 1 can be a duoplasmatron type ion source generating negative ions by transforming a gaseous material into plasma or a cesium sputtering type ion source generating negative ions by bombarding a solid material with cesium ions. The negative ions generated in and released from the negative ion source 1 is properly deflected by a deflecting electromagnet 2 and introduced in a low energy transport unit 3. The negative ions introduced in the low energy transport unit 3 are accelerated and converged by a static electric field and introduced in an acceleration unit 4. A positive voltage on the order of MV is applied in the middle part of the acceleration unit 4. The introduced negative ions are accelerated up to the middle part. Reaching the middle part of the acceleration unit 4, the negative ions pass through a gas such as argon gas and are transformed into positive ions by charge stripping. Then, the positive ions are accelerated up to the other end of the acceleration unit 4. Gaining a high level of energy on the order of MeV in the acceleration unit 4, the positive ions pass through a high energy transport unit 5 and are introduced in an analysis screening unit 6. With the help of electric and magnetic fields, the analysis screening unit 6 allows only predetermined ion species to proceed to the analysis chamber 7 based on the mass and charge of the positive ions. In the following description, the present invention will be embodied using a hydrogen ion beam (proton beam) as an ion beam 21. The above described units of the PIXE analysis apparatus are placed in a vacuum container. When the sample is carried in/out, only the analysis chamber 7 is open to an atmosphere.

An internal structure of the analysis chamber 7 will be described hereafter. As shown in FIG. 1B, the analysis chamber 7 comprises a sample support 8 on which a sample (semiconductor substrate) 10 is placed. The sample support 8 is in the form of a disc and rotatable about a diametrically extending rotation axis 9 by 0.5° per step. Therefore, the angle between the incident direction of the proton beam 21 and the sample support 8 can be set for any angle by 0.5° per step. Although not particularly restricted, here, the rotation axis 9 is oriented vertically. The sample support 8 can two-dimensionally be moved by 0.1 mm per pitch in two directions perpendicular to each other in a plane parallel to the surface thereof. The moving mechanism is rotated about the rotation axis 9 as the sample support 8 rotates. Then, the sample support 8 can always two-dimensionally be moved in a plane parallel to the surface thereof. Consequently, the proton beam 21 can be entered at any desired position on the entire surface of a sample 10. The rotation angle and two-dimensional movement of the sample support 8 are realized by controlling a stepping motor for the rotation and movement provided in the analysis chamber 7 according to instructions from a position control unit placed in the atmosphere area.

An energy dispersive X-ray (EDX) detector 11 is provided in the analysis chamber 7. As is well known, the X-ray detector 11 consists of a silicon semiconductor and the like and converts an X-ray 22 excited by the entered proton beam 21 and emitted from the sample 10 to electric current pulses proportional to the X-ray energy. The number of pulses is counted for each X-ray energy (pulse intensity), whereby the X-ray spectrum over a range of energy (hereafter referred to as the EDX spectrum) is obtained. As shown in FIG. 2, an angle θ between a normal line 31 to the surface of the sample 10 or a substrate and the incident direction of the proton beam 21 ($0° \leq θ < 90°$) is defined as a proton incident angle θ.

Figure 3:
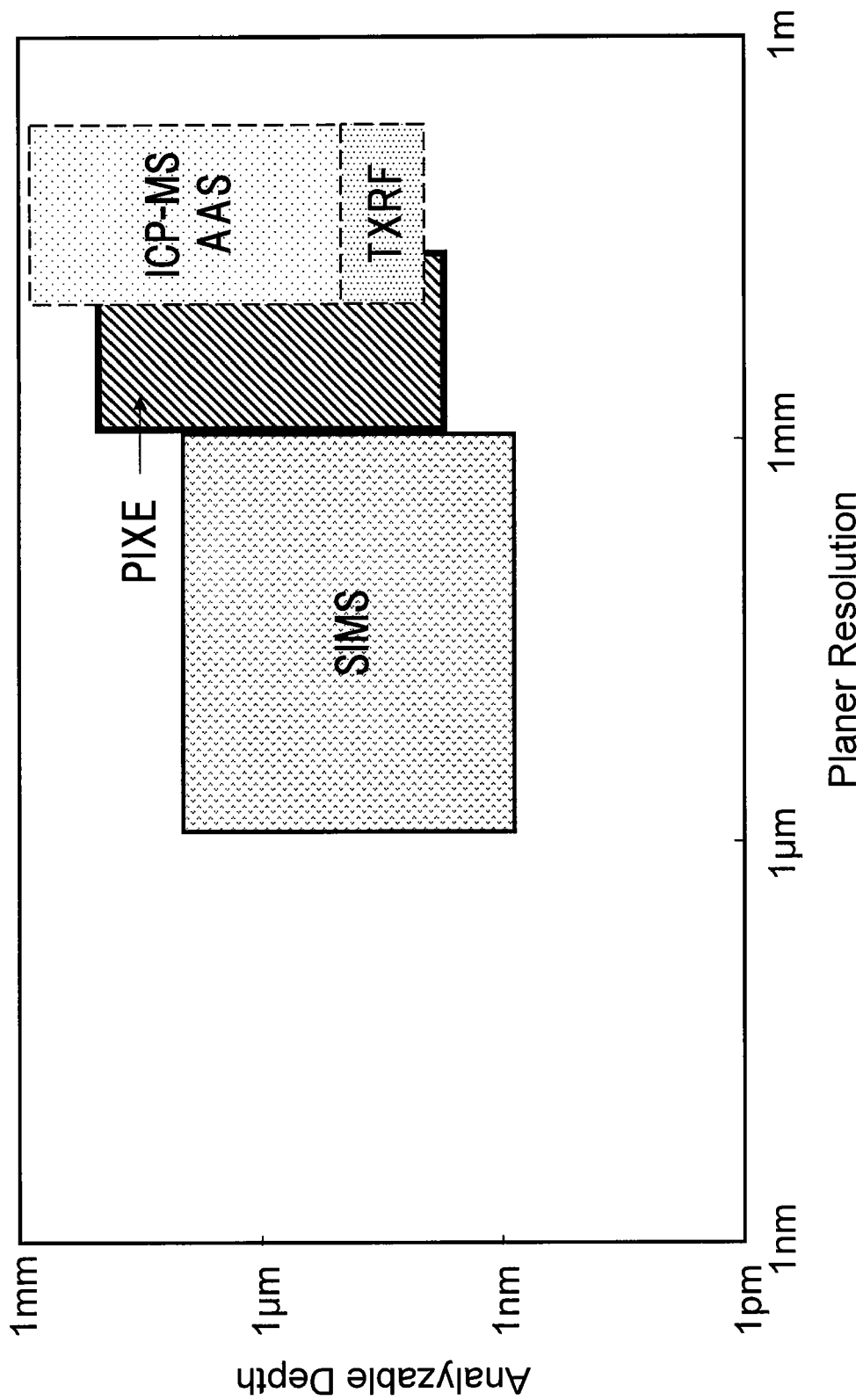
FIG. 3 is a chart showing a planar resolution and analyzable depth of elemental analysis method relating to the present invention and various contamination analysis methods.

FIG. 3 is a chart showing a planar resolution and actually analyzable depth of the above described various elemental analysis methods and PIXE method. The planar resolution and actually analyzable depth of the PIXE method are determined by the proton beam diameter and proton incident angle θ. As shown in FIG. 3, the planar resonation of the PIXE method is approximately 1 mm to ten plus several mm and the analyzable depth of the same is several nm to approximately 100 μm. As understood from the FIG. 3, the PIXE method can characteristically cover the analysis range that the SIMS, ICP-MS, AAS, or TXRF cannot cover.

First Embodiment

A first embodiment relating to the present invention presents a case in which conductivity determining impurities ion-implanted in a silicon monocrystal substrate (hereafter referred to appropriately as the Si substrate) is detected. In this embodiment, a sample formed by ion-implanting arsenic ions ($As^+$) over the entire surface of a Si substrate having no pattern on the surface (hereafter appropriately referred to as a bare substrate) is used. The arsenic ions are implanted with an accelerating energy of 10 KeV and a dose amount of 5E14 atoms/cm$^2$.

Figure 4:
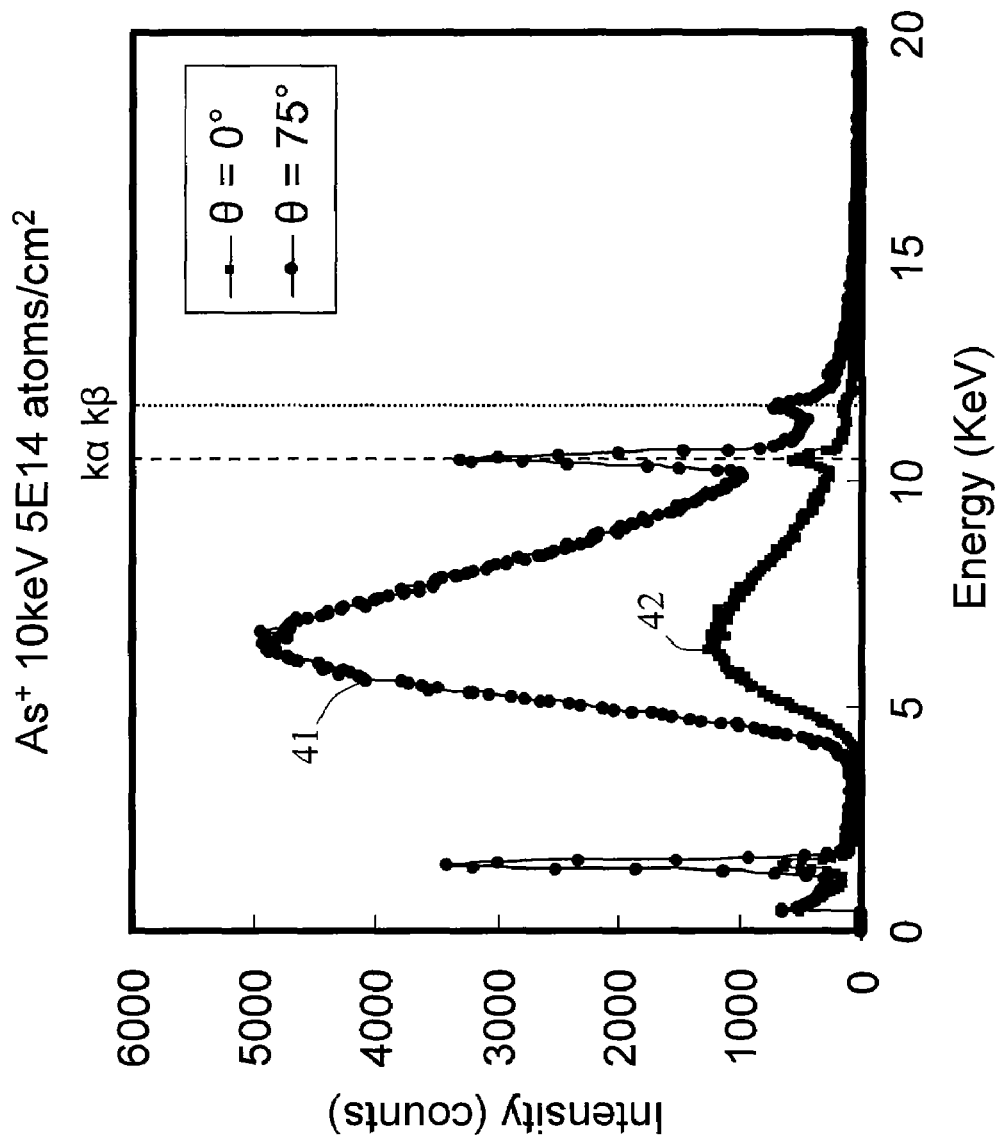
FIG. 4 is a graphical representation showing an EDX spectrum in the first embodiment relating to the present invention.

FIG. 4 is a graphical representation showing the EDX spectrum obtained from the above sample using the PIXE analysis apparatus shown in FIGS. 1A and 1B. In FIG. 4, the intensity (counts) of the X-ray 22 emitted from the sample by the entered proton beam 21 is plotted as ordinate and the energy value of the emitted X-ray is plotted as abscissa. The incident proton beam 21 has energy of 3 MeV. The proton beam has a diameter of 1 mmφ. The proton incident angle θ is 75°. The elemental analysis method relating to the present invention is characterized in that the proton incident angle is larger than 0° and here is set for 75° although it is traditionally 0°. FIG. 4 also shows the EDX spectrum obtained with a proton incident angle θ of 0° for comparison. In FIG. 4, the curve 41 (circles) presents the case in which the proton incident angle θ is 75° and the curve 42 (squares) presents the case in which the proton incident angle θ is 0°. The X-ray detector 11 is placed at a position where the angle between the line connecting the incident point of the proton beam 21 on the sample 10 to the X-ray entrance of the X-ray detector and the incident direction of the proton beam 21 (the angle δ in FIG. 2) is 45°.

As shown in FIG. 4, both spectral curves 41 and 42 have a wide peak in the emitted X-ray energy range from approximately 4 KeV to approximately 15 KeV. These peaks each present a continuous spectrum from bremsstrahlung released by the protons entered into the Si substrate when they decelerate and lose the kinetic energy due to interaction with the crystal lattice of the Si substrate. Both spectral curves 41 and 42 manifest a continuous spectrum from bremsstrahlung and characteristic X-ray spectral peaks corresponding to arsenic. Here, the arsenic kα ray appears at 10.53 KeV as shown by a broken line in FIG. 4 and the arsenic kβ ray appears at 11.73 KeV as shown by a dotted line in FIG. 4. The spectral peak around 2 KeV is a peak caused by the PIXE analysis apparatus itself.

As understood from FIG. 4, when the dose amount is $5×10^{14}$ atoms/cm$^2$, the intensities of arsenic characteristic X-rays kα and kβ are higher than the intensity of the continuous spectrum from bremsstrahlung even if the proton incident angle θ is 0° (the curve 42); therefore, both characteristic X-rays can be detected. However, as apparent from the comparison between the spectral curves 41 and 42, when the proton incident angle θ is 75°, the emitted X-ray intensity is increased and the presence of arsenic characteristic X-rays kα and kβ can more clearly and easily be detected.

The above results are obtained presumably for the following reason. Arsenic ion-implanted at an accelerating energy of approximately 10 KeV is present in the uppermost surface layer of the Si substrate at a high density. Therefore, when the proton beam 21 is entered into the Si substrate surface at an angle (grazing incidence), the protons entered into the Si substrate collide with a larger number of arsenic. Then, the amount of characteristic X-ray emitted from the Si substrate is increased when the proton beam 21 is entered into the Si substrate surface at an angle. Furthermore, when the proton beam 21 is entered into the Si substrate surface at an angle, the protons penetrate less deep within the Si substrate. The bremsstrahlung occurring deep within the Si substrate is absorbed in part before it reaches the Si substrate surface while the bremsstrahlung occurring at the shallow part of the Si substrate is less subject to absorption. Therefore, when the proton beam 21 is entered into the Si substrate surface at an angle, the intensity of the continuous spectrum from bremsstrahlung is increased. However, because increase in the intensity of characteristic X-ray is larger than increase in the intensity of bremsstrahlung when the proton beam 21 is entered into the Si substrate surface at an angle, the S/N ratio is consequently improved.

Figure 5:
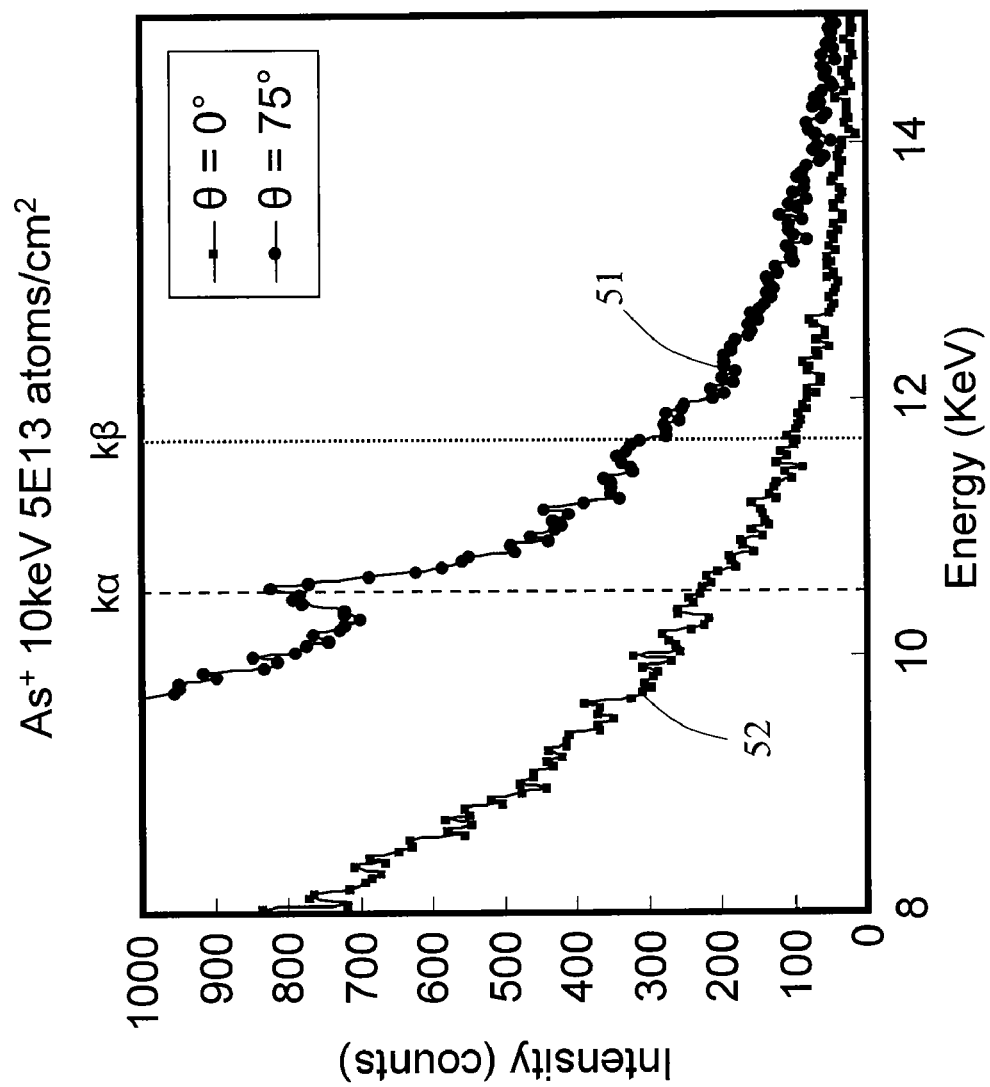
FIG. 5 is a graphical representation showing another EDX spectrum in the first embodiment relating to the present invention.

FIG. 5 is an enlarged view of an essential part of the EDX spectrum obtained by the PIXE analysis apparatus on a sample prepared by ion-implanting arsenic ions in a bare substrate with an accelerating energy of 10 KeV and a dose amount of 5E13 atoms/cm². The incident proton beam 21 has energy of 3 MeV. The proton beam has a diameter of 1 mmφ. The proton incident angle θ is 75°. FIG. 5 also shows the EDX spectrum obtained with a proton incident angle θ of 0° for comparison. In FIG. 5, the curve 51 (circles) presents the case in which the proton incident angle θ is 75° and the curve 52 (squares) presents the case in which the proton incident angle θ is 0°. The arsenic kα ray is indicated by a broken line in FIG. 5 and the arsenic kβ ray is indicated by a dotted line in FIG. 5. The X-ray detector 11 is placed in the same manner as in FIG. 4.

As understood from FIG. 5, when the dose amount is $5 \times 10^{13}$ atoms/cm², the intensities of arsenic characteristic X-rays kα and kβ are lower than the intensity of the continuous spectrum from bremsstrahlung in the case where the proton incident angle θ is 0°; therefore, both characteristic X-rays cannot be detected. Conversely, when the proton incident angle θ is 75° (the curve 51), the intensity of arsenic characteristic X-ray kα is higher than the intensity of the continuous spectrum from bremsstrahlung; therefore, the arsenic can be detected. With the proton incident angle θ being 75°, the S/N ratio is improved and the presence of arsenic can be detected well even if the dose amount is as small as 5E13 atoms/cm². Here, when the proton incident angle θ is 75°, the arsenic ion-implanted with an accelerating energy of 10 KeV can presumably be detectable for a dose amount up to as low as $3 \times 10^{13}$ atoms/cm² based on the intensity of the arsenic characteristic X-ray kα and the intensity of the continuous spectrum from bremsstrahlung of the spectral curve 51 shown in FIG. 5.

In the elemental analysis method relating to the present invention, the ratio of the characteristic X-ray peak intensity to noise such as the Si substrate bremsstrahlung spectrum (the S/N ratio) can be improved by using a proper proton incident angle θ larger than 0°, particularly preferably in a range of 70°<θ<90° in the PIXE method. Consequently, the impurity elements in the substrate can be detected in a highly sensitive manner. Quantification of the injection amount will be described in a second embodiment.

Second Embodiment

In the first embodiment, it is stated that the conductivity determining impurity element present in a Si substrate can be detected in a highly sensitive manner. In this embodiment, it will be stated that heavy metal elements that become contaminants in a Si substrate can be detected by the elemental analysis method relating to the present invention in a highly sensitive manner. Table 1 shows exemplary results of analyzing heavy metal elements present in a Si substrate using the above described PIXE analysis apparatus.

TABLE 1

| sample | element | detected amount (ng/cm²) | surface density (atoms/cm²) | density converted to the entire wafer surface (atoms/cm²) |
|---|---|---|---|---|
| R1** | — | — | — | — |
| R2 | Co | 13.9 | 4.45E13 | 1.10E12 |
|  | Cu | 24.7 | 7.33E13 | 1.81E12 |
|  | Ni | 17.4 | 5.59E13 | 1.38E12 |
|  | As | 14.1 | 3.55E13 | 8.74E11 |
| R3** | — | — | — | — |
| R4 | Fe | 33.3 | 1.12E13 | 2.77E12 |
|  | Co | 23.7 | 7.58E13 | 1.87E12 |
|  | Ni | 20.3 | 6.52E13 | 1.61E12 |
| R5 | Co | 25.0 | 8.00E13 | 1.97E12 |
|  | Cu* | 8.5 | 2.52E13 | 6.22E11 |
|  | Zn* | 10.3 | 2.97E13 | 7.32E11 |
| R6** | — | — | — | — |

Footnote)
*below the detection limit;
**undetected

The samples used in the analysis of this embodiment were bare substrates prepared by forming semiconductor integrated circuits (semiconductor elements) in the surface layer (here, the layer up to several microns from the surface) of a Si substrate, removing the integrated circuit constituents and the like, and further polishing to completely remove the surface layer. The samples R1 to R6 were preliminarily analyzed for heavy metal elements adhered to the surface by the TXRF method. The contaminant element per unit area on the surface was 1E10/cm² or lower (below the detection limit). Incidentally, the above removal of integrated circuit constituents, for example, the removal of all films such as Al wirings, interlayer insulating films, gate electrodes, and gate oxide films formed on the Si substrate using hydrofluoric acid and the like. The analysis conditions were as follows: the proton beam 21 had energy of 3 MeV and the proton beam had a diameter of 1 mmφ. The data shown in Table 1 were obtained for a proton incident angle θ of 0°, which will be described later. In Table 1, the symbol "*" following some element names indicates that that the characteristic X-ray intensity was lower than the background signal intensity in the EDX spectrum obtained by the PIXE analysis apparatus. The detected amount for such elements is the background signal intensity and the detected amount corresponds to the detection limit of the PIXE analysis apparatus. In Table 1, the symbol "**" following some sample numbers indicates that the characteristic X-ray intensities of all heavy metal elements were lower than the background signal intensity in the EDX spectrum.

The surface density (atoms/cm$^2$) in Table 1 can be calculated as follows. As described above, the X-ray detector 11 counts the intensity of the emitted X-ray 22 as the number of particles (photons) having the energy of the X-ray. Here, a parameter A is defined that indicates the number of impurity elements present in a region of the Si substrate where protons enter and emitting the characteristic X-ray when one count of characteristic X-ray is detected. The number of impurity elements N present in the region of the Si substrate where protons enter is given by N=I×A in which I is the intensity (counts) of characteristic X-ray obtained by the X-ray detector 11. In such a case, the surface density n (atoms/cm$^2$) can be calculated by n=N/S=(I×A)/S. For example, assuming that the region of the Si substrate where protons enter is expressed by S×$h_e$ in which S is the beam area on the Si substrate surface and $h_e$ is the effective reaching distance of the proton beam in the Si substrate, the number of impurity elements per unit volume of the Si substrate $N_D$ (atoms/cm$^3$) is expressed by $N_D$=N/(S×$h_e$). Here, the effective reaching distance $h_e$ is the penetration depth from the substrate surface at which protons can collide with atoms and emit characteristic X-rays. In this case, the surface density n can be calculated by multiplying the number of impurity elements per unit volume $N_D$ by the effective reaching distance of the proton beam in the Si substrate $h_e$, namely n=$N_D$×$h_e$=N/S=(I×A)/S. Here, the region of the Si substrate where protons enter is approximated for explanation. However, the above calculation is made on the region of the Si substrate where protons enter in consideration of collision and scattering of protons entering the Si substrate in practice. The above parameter A is calculated using the reaction cross section between the protons and impurity atoms corresponding to the characteristic X-ray, number of protons entering the sample (proton beam current density), detection efficiency of the X-ray detector 11, absorptance of the characteristic X-ray in the case where some of the emitted characteristic X-ray is absorbed before reaching the X-ray detector 11, and solid angle of the X-ray detector 11. Here, the reaction cross section is the probability of a single specific element that is the only such element in the unit volume of the sample emitting the characteristic X-ray due to a proton that is the only proton entered in the unit area. In the above calculation of the surface density, the proton incident angle θ is reflected in the beam area S.

The surface density calculated as described above is the unit generally used in the metal contamination analysis. EDX spectral analysis software for EDX spectra obtained by the PIXE analysis apparatus can be used for such calculation. The density or injection amount of the conductivity determining impurities described in the first embodiment can also be quantified by the above calculation.

The detected amount (ng/cm$^2$) in Table 1 can also be calculated by multiplying the surface density by the mass number of the impurity element. Although not mentioned in the first embodiment, the density (atoms/cm$^3$) and surface density (atoms/cm$^2$) of a conductivity determining impurity such as arsenic can also be calculated in the same manner as for the heavy metal impurities of this embodiment.

It is understood from Table 1 that the heavy metal elements can easily be detected by the PIXE analysis apparatus in the same manner as for the conductively determinant impurity described in the first embodiment in a highly sensitive manner. Furthermore, the density and surface density of heavy metal elements can be quantified based on the obtained EDX spectrum. More specifically, the samples shown in Table 1 yielded values below the detection limit by the TXRF method before the PIXE measurement. However, the measurement results from the PXIE analysis apparatus confirmed that some heavy metal elements were present in several samples (Samples R2, R4, and R5 in Table 1). The results suggest that no heavy metal was present on the Si substrate surface but some heavy metal impurities were present inside the silicon substrate. The results also indicate that heavy metal impurities can be scattered deep within the Si substrate along with treatments such as ion implantation, plasma etching, and oxygen plasma ashing, film formation, and thermal treatment performed in the manufacturing process of semiconductor integrated circuit devices.

The detected amount and surface density in Table 1 are values corresponding to the entrance area of the proton beam on the Si substrate surface, suggesting that heavy metal elements locally present in the Si substrate can be detected in the range of this entrance area. The density converted to the entire wafer surface (atoms/cm$^2$) in Table 1 is the surface density on the assumption that the same number of heavy metal elements as those present in a unit area of any local region of the Si substrate (the region of the entrance area of the proton beam on the Si substrate surface) are present uniformly throughout the entire Si substrate surface. The density converted to the entire wafer surface is calculated by dividing the number of impurity elements per unit volume calculated as described above by the total area of the Si substrate.

Although Table 1 shows the data for the proton incident angle θ of 0°, the EDX spectrum of the emitted X-ray for the proton incident angle θ larger than 0° is obtained in the present invention. Therefore, as described in the first embodiment, the S/N ratio is improved compared with the case in which the proton incident angle θ is 0° and the heavy metal impurity elements are detected in a more sensitive manner. More specifically, the detection limit shown in Table 1 can further be lowered and the heavy metal impurity elements can be detected with a higher degree of accuracy.

As described above, the impurity analysis employing the PIXE method allows for detection of impurity elements present deep within the Si substrate, which are not detected in the conventional semiconductor integrated circuit device manufacturing process, because of penetration depth as large as several μm to several tens μm when a proton beam having energy of several MeV is entered into the Si substrate. Using a proper proton beam diameter (for example on the order of μm), localized impurity elements can be detected. Furthermore, using a proton beam diameter on the order of mm, the entire Si substrate surface can be scanned with the proton beam to enter the proton beam and measure the characteristic X-ray at multiple points of the Si substrate, whereby the in-plane distribution of abundance (surface density) in the Si substrate of impurity elements such as heavy metals can quantitatively be obtained. Furthermore, with the proton incident angle being changed to enter the proton beam into the Si substrate at multiple proton incident angles, the effective reaching depth of protons in the Si substrate varies. Then, the proton beam is entered and the characteristic X-ray is measured at each proton incident angle, whereby the in-depth distribution of abundance in the Si substrate of impurity elements such as heavy metals can quantitatively be obtained.

For analyzing impurities in the Si substrate, the theoretical impurity element detection limit of this method is a surface density of approximately 1×10$^{13}$ atoms/cm$^2$ based on the theoretical calculation of continuous spectrum from bremsstrahlung. The detection limit varies depending on elements. For heavy metal impurities, the detection is validated with a surface density of approximately 3×10$^{13}$ atoms/cm$^2$.

Third Embodiment

In the above first embodiment, the elemental analysis method for analyzing a conductivity determinant element ion-implanted in a Si substrate using the PIXE analysis apparatus is described. In the method described in the first embodiment, although the intensity of characteristic X-ray of an impurity element to be analyzed (arsenic in the above description) can be increased, the continuous spectrum from bremsstrahlung still occurs and, for this reason, it is difficult to detect a small dose amount of conductivity determining impurity and measure the injection amount thereof. Then, an elemental analysis method capable of detecting a much smaller amount of impurity and measuring a much smaller abundance will be described in a third embodiment relating to the present invention.

This embodiment will describe a case in which the amount of impurity implanted in a resist film is obtained with a high degree of accuracy using the PIXE analysis apparatus shown in FIGS. 1A and 1B. The sample used in this elemental analysis method is prepared by forming a resist film on a Si substrate and ion-implanting a conductivity determining impurity in the resist film. In this elemental analysis method, the proton beam is entered into the resist surface at a large proton incident angle θ to analyze the conductive impurity.

FIG. 6 is a graphical representation showing the EDX spectrum obtained from a sample having a resist film on a Si substrate and in which arsenic is ion-implanted at a low dose amount of $1 \times 10^{13}$ atoms/cm$^2$ (the accelerating energy is 10 KeV). As in FIGS. 4 and 5, the X-ray intensity (counts) emitted from the sample upon entrance of a proton beam is plotted as ordinate and the emitted X-ray energy value is plotted as abscissa. Here, the resist film is a KrF lithography chemically-amplified resist having a thickness of 5 μm. The incident proton beam has energy of 3 MeV and the proton beam has a diameter of 1 mmφ. The proton incident angle θ is 88°.

As understood from FIG. 6, a continuous spectrum from bremsstrahlung of the Si substrate occurs in an emitted X-ray energy range from approximately 4 KeV to approximately 15 KeV. However, for example, as easily understood from the comparison with the spectral curve 51 shown in FIG. 5, the spectral curve 61 of this embodiment presents a continuous spectrum smaller in intensity. Because of the attenuated continuous spectrum from bremsstrahlung, the arsenic characteristic X-ray (kα ray and kβ ray) can be detected in spite of a low dose amount of $1 \times 10^{13}$ atoms/cm$^2$.

As in this embodiment, by using a sample having a resist film on a Si substrate, a much smaller dose amount of conductivity determining impurity can be detected and, furthermore, the conductivity determining impurity can be quantified by the above described method with a high degree of accuracy. The impurity detection limit of this method is approximately $1 \times 10^{12}$ atoms/cm$^2$ based on the calculation using the noise and bremsstrahlung components of the emitted X-ray. The proton incident angle θ can be 0°<θ<90°, but it is particularly preferably 70°<θ<90°.

In this embodiment, as shown in FIG. 7, the proton beam 21 is entered into a resist film 72 formed on a Si substrate 71 and in which impurity is implanted at a large incident angle. Here, the proton beam 21 entered into the resist film 72 passes through the resist film 72 at a small angle and reaches the Si substrate 71. In this case, because the proton beam 21 loses energy while passing through the resist film 72 and the proton incident angle θ is large, the effective reaching depth of the proton beam 21 in the Si substrate 71 (the depth at which the characteristic X-ray is emitted) is small. In other words, a reduced number of silicon atoms contribute to bremsstrahlung and the intensity of continuous spectrum from bremsstrahlung is diminished. Under the above implantation conditions, almost all ion-implanted conductivity determining impurity elements are present near the surface of the resist film 72. Therefore, in the sample form of this embodiment, the factors such as no bremsstrahlung from silicon atoms in the region where the characteristic X-ray 22 is emitted from the conductivity determining impurity element and a smaller penetration depth of protons in the Si substrate presumably contribute the reduced intensity of continuous spectrum from bremsstrahlung. Conversely, in the sample prepared by ion-implanting a conductivity determining impurity element in the Si substrate, Si bremsstrahlung concurrently occurs in the region where the conductivity determining impurity emits the characteristic X-ray 22.

If the beam energy of the proton beam 21 is reduced, the proton beam 21 penetrates less deep in the Si substrate. Then, the intensity of continuous spectrum from Si bremsstrahlung can be diminished by reducing the beam energy of the proton beam 21. However, the characteristic X-ray reaction cross section becomes smaller when the beam energy is reduced, deteriorating the detection ability. Therefore, the characteristic X-ray detection sensitivity cannot be improved by simply reducing the beam energy of the proton beam 21.

The sample form used in this embodiment and shown in FIG. 7 has the following advantages when applied to the TXRF method described in the Description of the Related Art section. As described above, in the TXRF method. a fluorescent X-ray (for example a wavelength of 0.1279 nm and a energy range: Lβ1=9.673 KeV, Lβ2=9.962 KeV in the case of a tungsten (W) filament) is entered into the surface of a sample at a total reflection angle of smaller than approximately 0.5 degree to observe the characteristic X-ray from the impurity element.

When the TXRF method is applied to a sample in which a conductivity determining impurity element is introduced in a Si substrate by ion-implantation, bremsstrahlung as in the PIXE method does not occur in principle. However, the silicon characteristic X-rays are kα=1.74 KeV and kβ=1.829 KeV while the phosphorus characteristic X-rays are kα=2.013 KeV and kβ=2.136 KeV and the aluminum characteristic X-rays are kα=1.487 KeV and kβ=1.553 KeV. More specifically, in the EDX spectrum, the peaks for the phosphorus (N-type impurity) and aluminum (P-type impurity) characteristic X-rays are adjacent to the silicon characteristic X-rays. The Si element is the main component of a Si substrate. Therefore, the Si characteristic X-rays yield significantly large peak intensities and peak widths (X-ray energy spectral widths). Then, the peaks for the phosphorus and aluminum characteristic X-rays that are adjacent to the Si characteristic X-rays are buried in the peaks for the silicon characteristic X-rays and very difficult to detect.

In such a case, by using a sample having the above described structure in which a resist film is formed on a Si substrate and a conductivity determining impurity is introduced in the resist film, the detection sensitivity to the conductivity determining impurity such as phosphorus and aluminum can be improved even in the TXRF. In the TXRF using such a sample, the fluorescent X-ray is mostly entered only into the resist film by adjusting the total reflection angle. Then, atoms contained in the resist film such as C (carbon), Cl (chlorine), S (sulfur), O (oxygen), and H (hydrogen) are all light-weighted and, therefore, their characteristic X-rays do not overlap with the phosphorus and aluminum characteristic X-ray energy peaks. Consequently, the phosphorus and aluminum characteristic X-rays can easily be identified from the EDX spectrum. It is impossible to totally prevent the fluorescent X-ray from entering the Si substrate because of scattering of the fluorescent X-ray entering the substrate. However, with the incident angle of the fluorescent X-ray to the sample surface or the resist surface being adjusted to be larger than 0° and not larger than 0.5°, the phosphorus and aluminum characteristic X-ray intensities can be larger than the silicon characteristic X-ray intensities. In this way, phosphorus can easily be detected even in the TXRF method and the injection amount of phosphorus can be deduced.

A case in which a conductivity determining impurity element is detected is described above. With the method of this embodiment, the detection sensitivity can be improved in detecting other elements such as heavy metal elements. For example, when metal elements that have entered a Si substrate are measured by the PIXE analysis apparatus, a continuous spectrum from Si bremsstrahlung has an intensity peak at around 7 KeV (see FIG. 4). Therefore, it is difficult to detect heavy metal elements in the Si substrate that have a characteristic X-ray around 7 KeV in a highly sensitive manner. For example, the Fe characteristic X-ray spectral intensity peaks are $k\alpha$=6.400 KeV and $k\beta$=7.058 KeV; it is difficult to detect a tiny amount of Fe in the Si substrate. Conversely, using the sample structure in which a resist film is formed on a Si substrate and performing the PIXE analysis under the same analysis conditions as in FIG. 6, Fe can be detected in a highly sensitive manner. For example, the PIXE analysis on a metal-contaminated sample prepared by forming a resist film on a Si substrate and allowing iron to enter the resist film surface on purpose confirmed that a tiny amount, approximately $1\times10^{13}$ atoms/cm$^2$, of Fe can be detected.

The proton beam has a diameter of 1 mm$\phi$ to several mm$\phi$. Therefore, localized heavy metal elements can be detected and the heavy metal element distribution on the substrate can be obtained by scanning and analyzing the entire substrate surface with an increased proton incident angle $\theta$. With the proton beam diameter being set for an appropriate value (for example on the order of μm), the distribution of localized heavy metal elements can further be analyzed in detail.

In the above description, the film formed on a silicon substrate is a resist film. However, it is not restricted to a resist film and can be an organic resin film containing substantially no silicon element (containing at least C and H and additionally O, N, S, etc.). Here, the phrase "containing substantially no silicon element" means that no bremsstrahlung from silicon atoms is detected by the X-ray detector 11 upon entrance of a proton beam.

Fourth Embodiment

This embodiment will describe semiconductor device manufacturing processes containing the elemental analysis process using the elemental analysis methods in the first, second and third embodiments.

(a) Application to Quantitative Analysis of Conductivity Determining Impurity Elements As described above, the elemental analysis method relating to the present invention allows for quantification of the injection amount of conductivity determining impurities. Then, in a first aspect of semiconductor device manufacturing method using the elemental analysis method, the injection amount is measured by the elemental analysis method in the ion implantation step and then, for example, it is determined whether or not the process is allowed to proceed to the next step.

In this semiconductor device manufacturing method, when a predetermined ion implantation is performed on a product silicon substrate intended to form an integrated circuit, the ion implantation is performed also on an evaluation substrate under the same ion implantation conditions. Here, the evaluation substrate is a bare Si substrate having an exposed surface or a Si substrate having on the surface an organic resin film containing substantially no Si such as a resist film (hereafter referred to as a resin film-coated Si substrate). When the evaluation substrate is a resist film-coated Si substrate, the organic resist film can be a resist film serving as an ion implantation mask. In such a case, the product silicon substrate can also serve as the evaluation substrate. For example, the evaluation substrate is prepared by ion-implanting one evaluation substrate in each batch (processing lot) of silicon substrates introduced in the ion implantation apparatus at a time.

The ion-implanted evaluation substrate is transferred to the above described PIXE analysis apparatus and the concentration of the ion-implanted conductivity determining impurity is calculated by the above described method. Although not particularly restricted, here, an analytic computer associated with the PIXE analysis apparatus calculates the concentration.

The calculated concentration is entered in a process control system controlling a load/unload of processing lots into/from the manufacturing apparatuses in the semiconductor device production line. The process control system compares the entered concentration with a predetermined standard value and determines whether or not the processing lot is allowed to proceed to the next step. For example, when the product silicon wafer also serves as the evaluation substrate, the concentrations obtained from the product silicon substrates are evaluated and only the product silicon substrates that are allowed to proceed to the next step proceed to the next step in one possible configuration. In another possible configuration, the concentration obtained from one product silicon substrate selected from the product silicon substrates belonging to the same processing lot is evaluated and, when it is allowed to proceed to the next step, this processing lot is allowed to proceed to the next step. When the product silicon wafer does not serve as the evaluation substrate, the concentration obtained from an evaluation substrate belonging to the processing lot is evaluated and, when it is allowed to proceed to the next step, this processing lot is allowed to proceed to the next step in one possible configuration. In another possible configuration, an evaluation substrate for the processing lot is first ion-implanted and, when the evaluation result of this evaluation substrate indicates that the conductivity determining impurity element concentration falls within the standard range, the product silicon substrates belonging to the same lot are ion-implanted.

The above described evaluation is particularly preferably applied to ion implantation for transistor threshold voltage control of ultrasmall system MOSLSIs using future fine process technology of 65 nm or smaller nodes, ion implantation for source/drain extension regions formed on a silicon substrate under the sidewall consisting of an insulating film provided to the gate electrode and having a junction depth of 50 nm or smaller, or ion implantation of low dose amounts such as ion implantation for forming photodiodes in a solid-state image pick-up device.

(b) Application to Heavy Metal Element Contamination Analysis

As described above, the elemental analysis method relating to the present invention allows for quantification of the abundance of heavy metal elements. In the second aspect of semiconductor device manufacturing process using the elemental analysis method, the abundance of heavy metal elements is measured by the elemental analysis method and then, for example, it is determined whether or not the process is allowed to proceed to the next step.

In this semiconductor device manufacturing method, when predetermined ions are implanted in a product silicon substrate intended to form an integrated circuit in the ion implantation step or when a product silicon substrate intended to form an integrated circuit (semiconductor element) is plasma-treated in the plasma treatment such as plasma etching step, an evaluation substrate is ion-implanted or plasma-treated under the same processing conditions. Here, the evaluation substrate is a bare Si substrate having an exposed surface or a resin film-coated Si substrate. In this case, the evaluation substrate immediately after the treatment contains heavy metal impurities such as Fe splashed from the sputtered chamber and the like of the processing apparatus. When the plasma treatment is ashing by plasma containing oxygen or hydrogen, the organic resin film of the resin film-coated Si substrate is removed. Therefore, it is preferable to use a bare Si substrate having an exposed surface as the evaluation substrate.

The evaluation substrate treated as described above is introduced in the above described PIXE analysis apparatus and the abundance (for example surface density) of ion-implanted heavy metal impurities is calculated by the above described method. Although not particularly restricted, here, an analytic computer associated with the PIXE analysis apparatus calculates the abundance.

The calculated abundance of heavy metal impurity elements is entered in the above described process control system. The process control system compares the entered abundance with a predetermined standard value and determines whether or not the processing lot is allowed to proceed to the next step. As described above, when the product silicon wafer also serves as the evaluation substrate, the abundance of heavy metal impurity elements obtained from the product silicon substrates is evaluated and only the product silicon substrates that are allowed to proceed to the next step proceed to the next step in one possible configuration. In another possible configuration, the abundance of heavy metal impurity elements obtained from one product silicon substrate selected from the product silicon substrates belonging to the same processing lot is evaluated and, when it is allowed to proceed to the next step, this processing lot is allowed to proceed to the next step. When the product silicon wafer does not serve as the evaluation substrate, the concentration obtained from an evaluation substrate belonging to the processing lot is evaluated and, when it is allowed to proceed to the next step, this processing lot is allowed to proceed to the next step in one possible configuration. In another possible configuration, an evaluation substrate for the processing lot is first treated and, when the evaluation result of this evaluation substrate indicates that the abundance of heavy metal impurity elements falls within the standard range, the product silicon substrates belonging to the same lot are treated.

The evaluation as described above is particularly preferable for the manufacturing process of CCD type or MOS type solid-state image pick-up devices. More specifically, heavy metal impurity elements that have entered deep within the Si substrate have adverse effects on the characteristics and causes defective images in solid-state image pick-up devices. Heavy metal impurities that have entered deep within the Si substrate, which are undetectable in the conventional manufacturing process, are quantitatively detected as described above in this manufacturing method, which is significantly beneficial for the solid-state image pick-up manufacturing process control.

On the other hand, the elemental analysis method of the present invention can be applied to a silicon substrate as follows: a product substrate in process on which integrated circuits are formed is extracted after various treatments such as plasma etching, ashing and thermal treatment, and various films constituting the integrated circuits formed on the product substrate, such as wiring and interlayer insulating films, are removed to expose the Si surface. In this way, the true surface density of heavy metal elements diffused deep within the Si substrate in the steps can be known.

In the elemental analysis method relating to the present invention, when the sample (substrate) is analyzed using multiple proton incident angles θ, the effective reaching depth of protons in the Si substrate varies and the surface density of heavy metal elements obtained in each measurement varies. Then, the general in-depth distribution of abundance of heavy metal elements in the Si substrate can be known. When the heavy metal abundance (surface density) calculated in this way does not meet the allowable standard, the substrate is excluded from the process to prevent spread of contamination in the subsequent steps. For making such a determination, for example, as described above, an analytic computer associated with the PIXE analysis apparatus calculates the amount of heavy metal impurities or in-depth distribution of amount of heavy metal impurities and the calculated data are entered to the process control system for the determination.

In addition, the Si substrate in which BMDs (bulk micro defects) capable of gettering of transition metal elements responsible for contamination are formed is generally used in solid-state image pick-up devices, particularly CCD type solid-state image pick-up devices. The BMDs serve as a gettering site during the high temperature treatment in the semiconductor integrated circuit manufacturing. However, the heat treatment temperature in the semiconductor integrated circuit device manufacturing process has recently been lowered as the element patterns become smaller. It becomes difficult to create BMDs deep within the Si substrate in such a low temperature process. Then, by incorporating the detection and quantitative analysis of heavy metal contamination in a substrate by the elemental analysis method relating to the present invention in the process control as an in-line inspection of the solid-state image pick-up devices manufacturing process, it can reliably be determined whether or not the BMDs are created in the solid-state image pick-up device produced in a low temperature process of 900° C. or lower. Then, the occurrence of defective images can be reduced.

As described above, the elemental analysis method relating t the present invention allows for detection of heavy metal impurities that have entered several μm to several tens μm deep within a semiconductor substrate in a reliable manner. Furthermore, the abundance of conductivity determining impurities introduced in a semiconductor substrate can be in-line quantified. The semiconductor device manufacturing method relating to the present invention allows for in-line determination of metal contamination, improving the manufacturing yield.

The above described embodiments do not restrict the technical scope of the present invention and, in addition to what is described above, various modifications and applications are available without departing from the technical idea of the present invention. For example, the elemental analysis method relating to the present invention is incorporated in the in-line inspection of solid-state image pick-up devices as a preferable embodiment in the above description. However, the elemental analysis method relating to the present invention can be used in the manufacturing process of any semiconductor device.

The present invention is useful for evaluation of amount of implanted dopant impurities and evaluation of magnitude of contamination by heavy metal impurities.

What is claimed is:

1. An analysis method for detecting an impurity element contained in a substrate, the analysis method comprising steps of:
   irradiating the substrate with an ion beam at an ion beam incident angle of larger than 0° and smaller than 90°, the ion beam incident angle being defined as an angle between a normal line to a surface of the substrate and an incident direction of the ion beam to the surface of the substrate; and
   measuring a characteristic X-ray excited by the irradiated ion beam and emitted from the impurity element contained in the substrate.

2. The analysis method according to claim 1, wherein:
   the ion beam is irradiated and the characteristic X-ray is measured at multiple points on the substrate, and
   an in-plane distribution of an amount of the impurity element in the substrate is obtained based on intensities of the characteristic X-ray measured at the multiple points on the substrate.

3. The analysis method according to claim 1, wherein:
   the ion beam is irradiated at multiple ion beam incident angles by changing the ion beam incident angles, and
   an in-depth distribution of an amount of the impurity element is obtained based on intensities of the characteristic X-ray measured with the multiple ion beam incident angles.

4. The analysis method according to claim 1, wherein the substrate is a silicon single crystal substrate on which an organic resin film containing substantially no silicon element is formed.

5. The analysis method according to claim 1, wherein the substrate is a silicon single crystal substrate.

6. The analysis method according to claim 4, wherein the organic resin film is a resist film.

7. The analysis method according to claim 1, wherein the impurity element is an impurity element determining a conductivity in the substrate.

8. The analysis method according to claim 1, wherein the impurity element is a metal element.

9. The analysis method according to claim 4, wherein the impurity element is an impurity element determining a conductivity in the silicon single crystal substrate and the impurity element is mostly contained in the organic resin film.

10. The analysis method according to claim 4, wherein the impurity element is a metal element and the metal element is mostly contained in the organic resin film.

11. An analysis method for detecting an impurity element, the analysis method comprising steps of:
    irradiating a substrate having an organic resin film formed on a silicon single crystal substrate with an X-ray at an angle of larger than 0° and not larger than 0.5° with respect to a surface of the substrate, the organic resin film containing the impurity element;
    measuring a characteristic X-ray excited by the irradiated X-ray and emitted from the impurity element contained in the organic resin film.

12. The analysis method according to claim 11, wherein the impurity element is phosphorus or aluminum.

13. A semiconductor device manufacturing method, the method comprising:
    a first ion implantation step of introducing a conductivity determining impurity element into a first silicon single crystal substrate on which semiconductor element is to be formed;
    a second ion implantation step of introducing the conductivity determining impurity element into a second silicon single crystal substrate under the same ion implantation conditions as in the first ion implantation;
    a step of irradiating the second silicon single crystal substrate with an ion beam at an ion beam incident angle larger than 0° and smaller than 90°, the ion beam incident angle being defined as an angle between a normal line to a surface of the second silicon single crystal substrate and an incident direction of the ion beam to the surface of the second silicon single crystal substrate;
    a step of measuring a characteristic X-ray excited by the irradiated ion beam and emitted from the conductivity determining impurity element introduced into the second silicon single crystal substrate; and
    a step of calculating a dose amount of the conductivity determining impurity element in the second ion implantation based on an intensity of the measured characteristic X-ray as a dose amount of the conductivity determining impurity element in the first ion implantation.

14. A semiconductor device manufacturing method, the method comprising:
    a first ion implantation step of introducing a conductivity determining impurity element into a first substrate that is a silicon single crystal substrate on which a semiconductor element is to be formed;
    a second ion implantation step of introducing the conductivity determining impurity element into a second substrate having an organic resin film containing substantially no silicon element formed on a silicon single crystal substrate under the same implantation conditions as in the first ion implantation;
    a step of irradiating the second substrate with an ion beam at an ion beam incident angle larger than 0° and smaller than 90°, the ion beam incident angle being defined as an angle between a normal line to a surface of the second substrate and an incident direction of the ion beam to the surface of the second substrate;
    a step of measuring a characteristic X-ray excited by the irradiated ion beam and emitted from the conductivity determining impurity element introduced in the second substrate; and
    a step of calculating dose amount of the conductivity determining impurity element in the second ion implantation based on an intensity of the measured characteristic X-ray as dose amount of the conductivity determining impurity element in the first ion implantation.

15. A semiconductor device manufacturing method comprising steps of:
    performing a predetermined treatment including an ion implantation treatment or a plasma treatment on a first substrate on which a semiconductor element is to be formed;
    performing a treatment on a second substrate under the same conditions as the predetermined treatment;
    irradiating the second substrate with an ion beam at an ion beam incident angle larger than 0° and smaller than 90°, the ion beam incident angle being defined as an angle between a normal line to a surface of the second substrate and an incident direction of the ion beam to the surface of the substrate;
    measuring a characteristic X-ray excited by the irradiated ion beam and emitted from the second substrate; and
    detecting whether a metal element is present in the second substrate based on the measured characteristic X-ray.

16. The semiconductor device manufacturing method according to claim 15, wherein the second substrate is a substrate on which an organic resin film containing substantially no silicon element is formed on a silicon single crystal substrate.

17. A semiconductor device manufacturing method comprising steps of:
- performing a predetermined treatment including an ion implantation treatment or a plasma treatment on a substrate including a silicon single crystal substrate in order to form a semiconductor element;
- removing various films formed on the silicon single crystal substrate for constituting the semiconductor element after the predetermined treatment;
- irradiating the substrate from which the various films are removed with an ion beam at an ion beam incident angle larger than 0° and smaller than 90°, the ion beam incident angle being defined as an angle between a normal line to a surface of the substrate from which the various films are removed and an incident direction of the ion beam to the surface of the substrate;
- measuring a characteristic X-ray excited by the irradiated ion beam and emitted from the substrate from which the various films are removed; and
- detecting whether a metal element is present in the substrate from which the various films are removed based on the measured characteristic X-ray.

18. The semiconductor device manufacturing method according to claim 15, wherein the semiconductor element is a solid-state image pick-up element.

19. The semiconductor device manufacturing method according to claim 17, wherein the semiconductor element is a solid-state image pick-up element.

20. The analysis method according to claim 1, wherein the ion bean incident angle is larger than 70° and smaller than 90°.

21. The semiconductor device manufacturing method according to claim 13, wherein the ion bean incident angle is larger than 70° and smaller than 90°.

22. The semiconductor device manufacturing method according to claim 14, wherein the ion bean incident angle is larger than 70° and smaller than 90°.

23. The semiconductor device manufacturing method according to claim 15, wherein the ion bean incident angle is larger than 70° and smaller than 90°.

24. The semiconductor device manufacturing method according to claim 17, wherein the ion bean incident angle is larger than 70° and smaller than 90°.

* * * * *